United States Patent [19]

Nakamura et al.

[11] Patent Number: 4,589,027
[45] Date of Patent: May 13, 1986

[54] SOLID STATE IMAGE SENSOR

[75] Inventors: Tsutomu Nakamura; Kazuya Matsumoto, both of Ina, Japan

[73] Assignee: Olympus Optical Co., Ltd., Tokyo, Japan

[21] Appl. No.: 743,774

[22] Filed: Jun. 12, 1985

[30] Foreign Application Priority Data

Jun. 19, 1984 [JP] Japan .................... 59-124590

[51] Int. Cl.$^4$ ........................... H04N 3/12
[52] U.S. Cl. ...................... 358/213; 357/24; 358/212
[58] Field of Search .................. 358/212, 213; 357/24 LR, 22

[56] References Cited

U.S. PATENT DOCUMENTS 4,300,151 11/1981 Nishizawa .................... 357/24
4,524,391 6/1985 Nishizawa et al. ............ 358/213
4,525,742 6/1985 Nishizawa et al. ............ 358/213

Primary Examiner—Gene Z. Rubinson
Assistant Examiner—Robert G. Lev
Attorney, Agent, or Firm—Parkhurst & Oliff

[57] ABSTRACT

A solid state image sensor including a number of pixels each of which has a source region, a drain region and a signal readout gate electrode having a portion formed between the source and drain regions, a light receiving gate electrode formed separately from the signal readout gate electrode, and a transfer gate electrode, the source and drain regions being formed in a surface of an epitaxial layer and the light receiving gate electrode, transfer gate electrode and signal readout gate electrode being formed on the epitaxial layer via a gate insulating film. After light signal charges have been stored underneath the light receiving gate electrode for a desired shutter open period in all pixels, the light signal charges are transferred into portions in the epitaxial layer underneath the signal readout gate electrodes via the transfer gate electrodes. Then, the light signal charges are successively readout by means of an XY address system to derive an output video signal.

9 Claims, 15 Drawing Figures

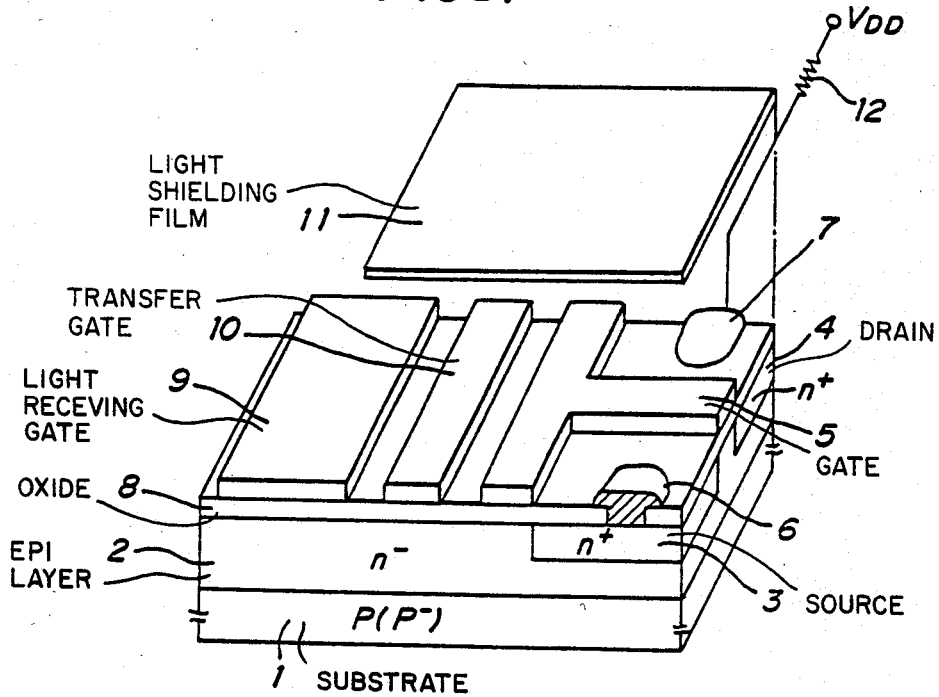
FIG._1
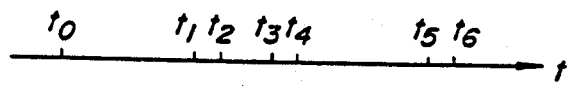
FIG. 2A
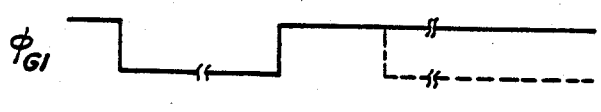
FIG. 2B
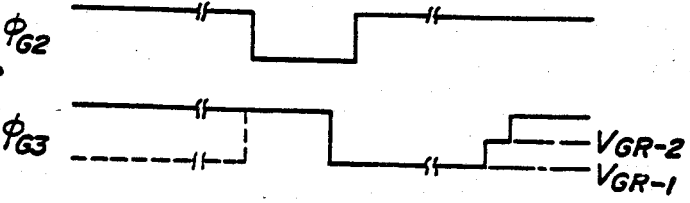
FIG. 2C

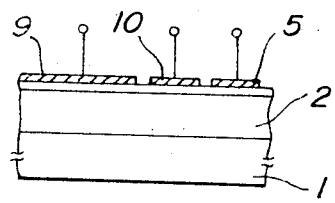
FIG._2D
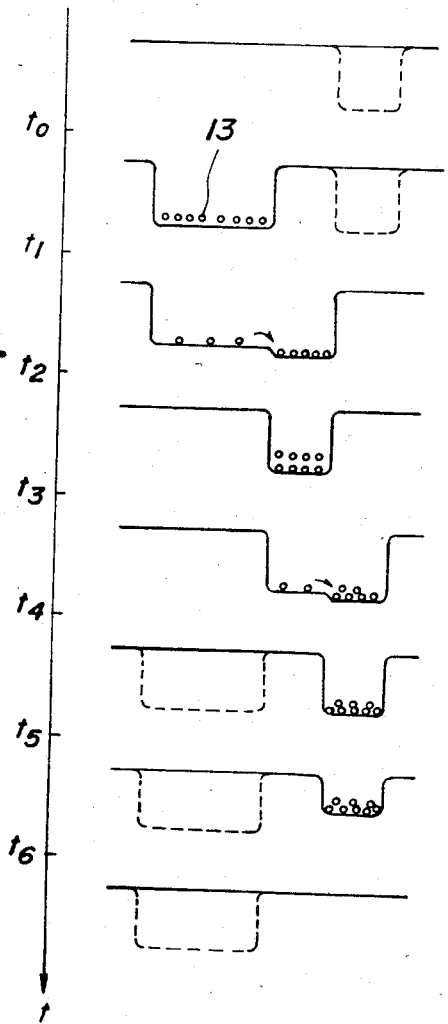
FIG._2E

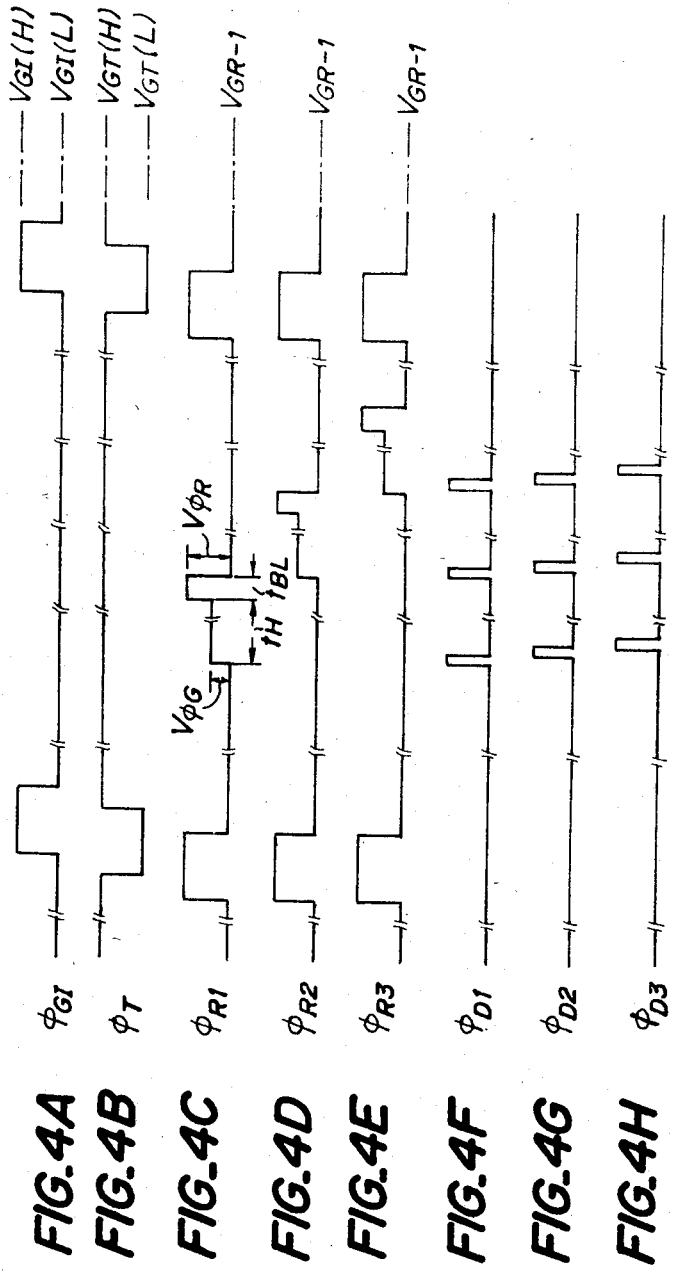

SOLID STATE IMAGE SENSOR

BACKGROUND OF THE INVENTION

The present invention relates to a solid state image sensor comprising pixels each of which includes a lateral type static induction transistor, and more particularly to a solid state image sensor having an electronic shutter function.

In a video camera comprising a solid state image sensor, since a light signal storing period corresponding to a shutter open period (shutter speed) is fixed to a constant period such as 1/60 second or 1/30 second in NTSC system, it is impossible to adjust freely the depth of field in accordance with the intension of a user. Moreover, since the shutter speed is fixed, when an object moving at a high speed is picked-up and recorded and then the recorded image is reproduced in a still mode, it is impossible to reproduce a sharp image.

The above mentioned drawbacks of the known solid state image sensor are mainly due to the fact that the shutter speed is fixed. In another known video camera using an interlace-line-transfer CCD image sensor (IL-CCD) or a frame-transfer type CCD (FT-CCD), the shutter speed may be variable, because image pick-up elements have the shutter function. However, due to the inherent characteristics of CCD, an amount of charge carriers which cause an output image signal is small, and thus the sensitivity is relatively low and S/N of the image signal is also small.

It has been also proposed to arrange a mechanical shutter in the video camera comprising the solid state image sensor. However, the mechanical shutter mechanism is complicated in construction and large in size and further life time, accuracy and reliability of the mechanical shutter are also insufficient. Further, it is undesired to use the mechanical shutter in view of the recent tendency of the compact video camera.

SUMMARY OF THE INVENTION

The present invention has for its object to provide a novel and useful solid state image sensor which has an electronic shutter function for adjusting a shutter speed over a wide range.

It is another object of the invention to provide a solid state image sensor which can reproduce a sharp image of an object moving at a high speed.

It is still another object of the invention to provide a solid state image sensor in which all the pixels can accumulate simultaneously light signal charges for the same adjustabe period.

It is still another object of the invention to provide a solid state image sensor in which a depth of field can be adjusted at will over a sufficiently wide range.

According to the invention, a solid state image sensor comprises a plurality of image sensing elements, each image sensing element including a lateral type static induction transistor having source and drain regions formed in a surface of a semiconductor body, and a signal readout gate means at least a part of which is formed between the source and drain regions;

a light receiving gate means formed separately from the signal readout gate means and constituting a photoelectric converting region;

a transfer gate means formed between the signal readout gate means and the light receiving gate means; and a light shielding film applied on the semiconductor body except for the light receiving gate means.

Further, according to the invention, a solid state image sensor comprises a plurality of image sensing elements, each comprising a lateral type static induction transistor having source and drain regions formed in a surface of a semiconductor body, and a signal readout gate means at least a part of which is formed between the source and drain regions, a light receiving gate means formed separately from the signal readout gate means and constituting a photoelectric converting region, a transfer gate means formed between the signal readout gate means and the light receiving gate means and a light shielding film applied on the semiconductor body except for the light receiving gate means;

a shutter control means for controlling the light receiving gate means, transfer gate means and signal readout gate means in such a manner that during a light signal accumulation period light signal charges are stored in the light receiving gate means and at the end of the light signal accumulation period the light signal charges are transferred via the transfer gate means into the signal readout gate means and the light receiving gate means is reset to an initial condition; and signal readout means for reading out an output image signal in accordance with the light signal charges transferred into the signal readout gate means.

BRIEF DESCRIPTION OF THE DRAWINGS

FIG. 1 is a schematic view showing an embodiment of an image sensing element constituting a pixel of the solid state image sensor according to the invention;

FIGS. 2A, 2B and 2C are signal waveforms for explaining the operation of the image sensing element of FIG. 1, FIG. 2D is a schematic cross section depicting the image sensing element, and FIG. 2E is a diagram showing the transfer of the signal charges in the image sensing element;

FIGS. 4A to 4H are signal waveforms for explaining the operation of the solid state image sensor shown in FIG. 3.

DESCRIPTION OF THE PREFERRED EMBODIMENTS

Figure 3:
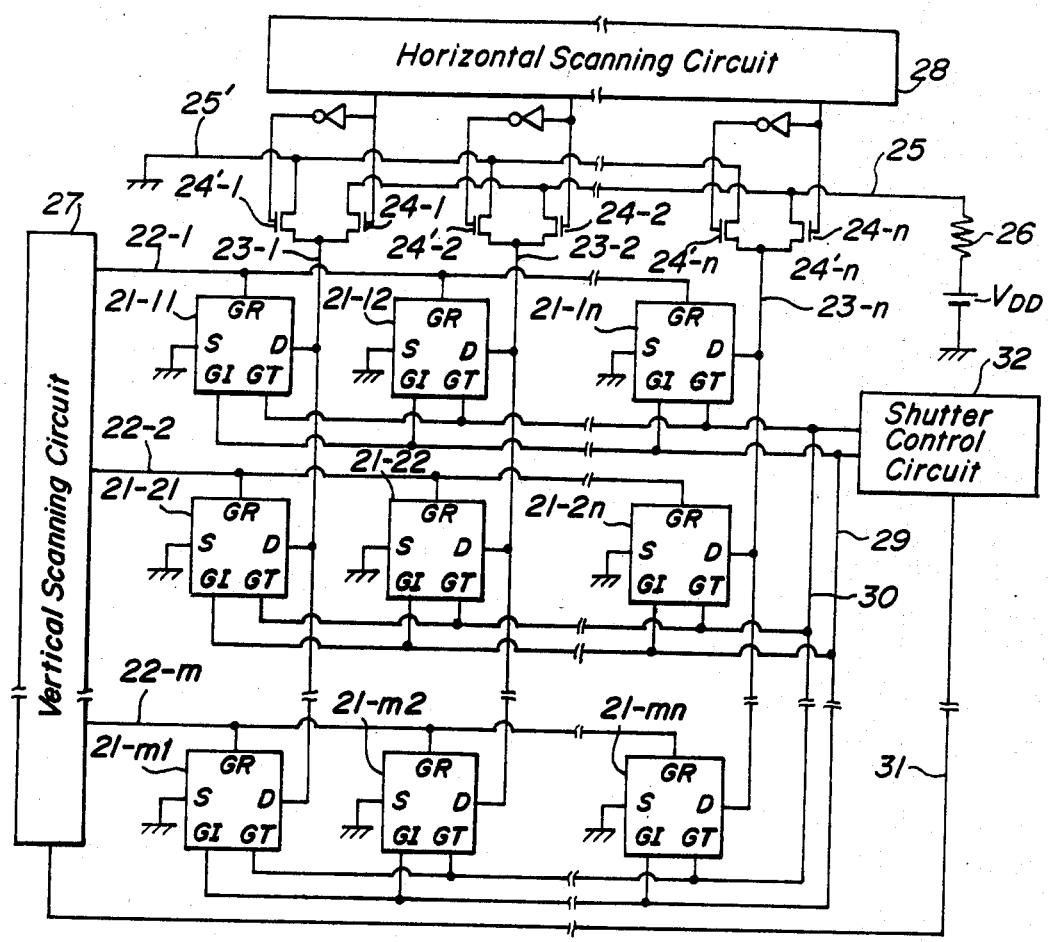
FIG. 3 is a circuit diagram illustrating an embodiment of the solid state image sensor according to the invention.

FIG. 1 is a schematic view showing a construction of a solid state image sensing element constituting a pixel of the solid state image sensor according to the invention having the electronic shutter function. The image sensing element comprises a light receiving gate, a transfer gate and a lateral type static induction transistor. The image sensor comprises a p or p⁻ type silicon substrate 1 and an n⁻ type silicon epitaxial layer 2 grown on the substrate 1 and having a lower impurity concentration than that of the substrate 1. On a surface of the epitaxial layer 2 is formed a thin gate oxide layer 8 having a thickness of 200 to 1,000 Å. On the oxide layer 8, there are formed light receiving gate electrode 9, transfer gate electrode 10 and signal readout gate electrode 5. It should be noted that the light receiving gate electrode 9 is made of transparent conductive material. In the epitaxial layer 2 there are formed an n⁺ source region 3 and an n⁺ drain region 4 of a lateral type static induction transistor. To the source and drain regions 3 and 4 are connected source electrode 6 and drain electrode 7, respectively. It should be further noted that except for the light receiving gate electrode 9 the image sensor is fully covered with a light shielding film 11.

Now the operational principle of the image sensing element will be explained in detail with reference to FIGS. 2A to 2E. FIGS. 2A to 2C show gate potentials $\phi_{G1}$, $\phi_{G2}$ and $\phi_{G3}$ applied to the light receiving gate electrode 9, transfer gate electrode 10 and signal readout gate electrode 5, respectively. In the present embodiment, the source electrode 6 is fixed to the ground potential and the substrate 1 is biased negatively with respect to the source region 3. At a timing $t=t_0$, the potential $\phi_{G1}$ applied to the light receiving gate electrode 9 is changed from positive to negative. Then, a portion underneath the light receiving gate electrode 9 is sufficiently depleted. It should be noted that the negative bias potential $\phi_{G1}$ to the light receiving gate electrode 9 is so determined that the depletion layer is positively formed underneath the gate electrode 9. Under this bias condition, holes, i.e. signal charges 13 of hole-electron pairs generated in the bulk of the epitaxial layer 2 in response to incident light are accumulated immediately underneath the light receiving gate electrode 9 to form an inversion layer.

At a timing $t=t_1$, a bias potential $\phi_{G2}$ applied to the transfer gate electrode 10 is changed from positive to negative, and thus an inversion layer is generated underneath the transfer gate electrode 10. Then, the signal charges 13 accumulated underneath the light receiving gate electrode 9 are transferred into a portion underneath the transfer gate electrode 10 to form the inversion layer immediately underneath the transfer gate electrode 10. The flow of the signal charges 13 is determined by a ratio in capacitance between the light receiving gate electrode 9 and transfer gate electrode 10 and a potential difference therebetween.

At a timing $t=t_2$, the potential $\phi_{G1}$ to the light receiving gate electrode 9 is returned to the positive value. Upto this timing almost all signal charges 13 accumulated underneath the light receiving gate electrode 9 are transferred into the inversion layer produced underneath the transfer gate electrode 10. If an amount of the signal charges is larger than that which can be stored in the inversion layer underneath the transfer gate electrode 10, an excess amount of the signal charges 13 flows away into the substrate 1. This function for removing the excess charges can be utilized to suppress the blooming in the video camera.

Next, at a timing $t=t_3$, the potential $\phi_{G3}$ applied to the signal readout gate electrode 5 is changed from a positive value to a negative value $V_{GR-1}$ and then an inversion layer is allowed to be existent underneath the signal readout gate electrode 5. Therefore, the signal charges 13 accumulated in the inversion layer underneath the transfer gate electrode 10 are transferred into the inversion layer produced immediately underneath the signal readout gate electrode 5. Until a timing $t=t_4$ at which the potential $\phi_{G2}$ applied to the transfer gate electrode 10 is returned to the positive value, almost all light signal charges 13 have been transferred into the inversion layer generated underneath the signal readout gate electrode 5. At the timing $t=t_4$, the transfer of the signal charges 13 is stopped and after the potential $\phi_{G2}$ to the transfer gate electrode 10 has returned to the positive value, the potential $\phi_{G1}$ to the light receiving gate electrode 9 may be changed again to the negative bias value at which the inversion layer may be produced underneath the light receiving gate electrode 9 as shown by a dot line in FIG. 2A so as to initiate the signal charge accumulation.

At a timing $t=t_5$, the potential $\phi_{G3}$ applied to the signal readout gate electrode 5 is changed to $V_{GR-2}$ ($V_{GR-1} \leq V_{GR-2} < 0$). During this bias condition, when a positive potential $V_{DD}$ is applied to the drain electrode 7 via a load resistor 12, there is derived an output image signal as the variation of the drain voltage, said output signal being dependent upon an amount of light impinging upon the light receiving gate electrode 9 during the time period $t_0$ to $t_2$.

At a timing $t=t_6$, when the positive potential is applied to the signal readout gate electrode 5, the holes, i.e. signal charges accumulated in the inversion layer underneath the signal readout gate electrode 5 are discharged. The above is one cycle operation of the lateral type static induction transistor constituting the pixel of the solid state image sensor according to the invention. Since the shutter open period is equal to the period $t_0$ to $t_2$, it is possible to adjust the shutter open period at will by suitably selecting the timing $t_2$ at which the potential $\phi_{G1}$ applied to the light receiving gate electrode 9 is changed from negative to positive.

Now, the solid state image sensor according to the invention will be explained. In general, a number of image sensing elements are arranged in a matrix form and an image signal is derived by effecting a raster scanning. As the raster scanning, there are proposed drain-gate selection system, source-gate selection system, and source-drain selection system. In an embodiment to be explained hereinbelow, use is made of the drain-gate selection system.

FIG. 3 is a block diagram showing an embodiment of the solid state image sensor according to the invention. In FIG. 3, each image sensing elements are shown by blocks in which GI denotes the light receiving gate electrode, GT transfer gate electrode, GR signal readout gate electrode, D drain electrode and S represents the source electrode. As illustrated in FIG. 3, m×n image sensing elements 21-11, 21-12 ... 21-21, 21-22 ... 21-mn are arranged in a matrix form and are readout by means of XY address system. A lateral type static induction transistor comprising an image sensing element may be formed by the lateral type static induction transistor shown in FIG. 1 in which a part of the signal readout gate region is provided between the source and drain regions or a lateral type static induction transistor in which the signal readout gate region surrounds at least one of the source and drain regions.

As illustrated in FIG. 3, the substrate for all the image sensing elements is biased negatively, all the source electrodes S are connected to the ground potential, all the light receiving gate electrodes GI are commonly coupled with a shutter control line 29 and all the transfer gate electrodes GT are commonly connected to a transfer control line 30. The shutter control line 29 and transfer control line 30 are connected to a shutter control circuit 32. Signal readout gate electrodes GR of image sensing elements aligned in respective rows are commonly connected to respective row lines 22-1, 22-2 ... 22-m. Further drain electrodes D of image sensing elements aligned in respective columns are commonly connected to respective column lines 23-1, 23-2 ... 23-n. The column selection lines 23-1, 23-2 ... 23-n are coupled with video line 25 and ground line 25' via column selection transistors 24-1, 24-2 ... 24-n and 24'-1, 24'-2

... 24'-, respectively. The video line 25 is connected to a video voltage source $V_{DD}$ via a load resistor 26.

The row lines 22-1, 22-2 ... 22-m are connected to a vertical scanning circuit 27 to receive successively signals $\phi_{GR1}$, $\phi_{GR2}$ ... $\phi_{GRm}$, respectively. Gates of the column selection transistors 24-1, 24-2 ... 24-n and 24'-1, 24'-2, ... 24'-n are connected to a horizontal scanning circuit 28 to receive signals $\phi_{D1}$, $\phi_{D2}$ ... $\phi_{Dn}$, and their inverted signals, respectively.

Now, the operation of the solid state image sensor shown in FIG. 3 will be explained with reference to waveforms illustrated in FIGS. 4A to 4H. FIG. 4a shows a voltage $\phi_{GI}$ applied to the shutter control line 29 connected to the light receiving gate electrodes GI and FIG. 4B illustrates a voltage $\phi_{GT}$ applied to the transfer control line 29 connected to the transfer gate electrodes GT. FIGS. 4C to 4E represent the vertical scanning signals $\phi_{GR1}$, $\phi_{GR2}$, $\phi_{GR3}$ applied to the row lines 22-1, 22-2, 22-3, respectively and FIGS. 4F to 4H denote the horizontal scanning signals $\phi_{D1}$, $\phi_{D2}$, $\phi_{D3}$ applied to the gates of column selection transistors 24-1, 24-2, 24-3, respectively. The vertical scanning signal includes a readout gate voltage of a small amplitude ($V_{GR-1} + V_{\phi G}$) and a reset gate voltage of a large amplitude ($V_{GR-1} + V_{\phi R}$). During an effective scanning period $t_H$ for each row line the readout gate voltage is available and during a horizontal blanking period $t_{BL}$ it assumes the reset gate voltage. The horizontal scanning signals $\phi_{D1}$, $\phi_{D2}$... have a low level for conducting the column selection transistors 24-1, 24-2 ... and cutting off the anti-selection transistors 24'-1, 24'-2 ..., and a high level by means of which the transistors 24-1, 24-2 ... are made conductive and the transistors 24'-1, 24'-2 ... are made non-conductive.

After the shutter control circuit 32 has supplied the signal $\phi_{GT}$ of low level $V_{GT}(L)$ during the vertical blanking period, the signal $\phi_{GI}$ becomes a high level $V_{GI}(H)$, and then the vertical scanning circuit 27 receives a trigger signal from the shutter control circuit 32 via a shutter trigger line 31. In response thereto, the vertical scanning circuit 27 supplies the vertical scanning signals $\phi_{GR1}$, $\phi_{GR2}$... Then as has been explained with reference to FIG. 1, signal charges stored underneath light receiving gate electrodes of each pixels 21-11, 21-12 ... 21-mn are transferred into positions immediately underneath the signal readout gate electrodes.

After that, when the vertical scanning signals $\phi_{GR1}$ becomes ($V_{GR-1} + V_{\phi G}$), the pixels 21-11, 21-12 ... 21-1n connected the first row line 22-1 are selected and the column selection transistors 24-1, 24-2 ... 24-n are made successively conductive by means of the horizontal scanning signals $\phi_{D1}$, $\phi_{D2}$ ... supplied from the horizontal scanning circuit 28. In this manner, the image signals generated at the pixels 21-11, 21-12 ... 21-1n are successively readout on the video line 25. These pixels 21-11, 21-12 ... 21-1n are simultaneously reset when the signal $\phi_{GR1}$ becomes the higher level ($V_{GR-1} + V_{\phi R}$).

Next when the vertical scanning signal $\phi_{GR2}$ becomes ($V_{GR-1} + V_{\phi G}$), the pixels 21-21, 21-22 ... 21-2n connected the second row line 22-2 are selected and these pixels are successively readout by the horizontal scanning signals $\phi_{D1}$, $\phi_{D2}$ ... to produce image signals on the video line 25. Then, the pixels 21-21, 21-22 ... 21-2n are simultaneously reset when the signal $\phi_{GR2}$ is changed to ($V_{GR-1} + V_{\phi R}$). In the manner mentioned above; the whole pixels are successively readout to obtain the image signal of one field.

The shutter open timing and shutter close timing correspond to a timing when the potential $\phi_{GI}$ applied to the light receiving gate electrode GI changes from $V_{GI}(H)$ to $V_{GI}(L)$ and a timing at which the potential $\phi_{GI}$ changes from $V_{GI}(L)$ to $V_{GI}(H)$, respectively. Therefore, by suitably selecting the above timings by means of the shutter control circuit, it is possible to adjust the shutter open period at will. Usually the maximum shutter open period is limited to the field period, and the shutter open period may be adjusted at will within this maximum period of one field. However, the shutter open period may be longer than the field period by introducing one or more fields during which the vertical scanning signals $\phi_{GR1}$, $\phi_{GR2}$ ... are not changed to the reset level ($V_{GR-1} + V_{\phi R}$).

In the above embodiment, the selection of pixels is effected by using the drain and gate electrodes of the lateral type static induction transistors forming the pixels. However, the selection system is not limited to such a drain-gate system, but the pixel selection may be performed by using the drain and source electrodes or the source and gate electrodes. Further, in the above embodiment use is made of the lateral type static induction transistor having the N type channel, but use may be made of a lateral type static induction transistor of P channel type. Moreover, in the above embodiment, the non-interlace system is adopted, but it is a matter of course to use the interlace system. Then, the image signal having a better quality may be obtained. In the above embodiment, the lateral type static induction transistor is connected as the common source configuration, but may be connected in the form of the source follower. Further, the image signal may be derived as the source or drain current.

As explained above in detail, in the solid state image sensor according to the invention the pixel is formed by the lateral type static induction transistor having the amplifying function. Therefore, it is possible to derive the image signal having the high S/N as compared with known solid state image sensors using MOS transistor, CCD or CPD which do not possess the amplifying function. Further, since the light receiving gate electrode and transfer gate electrode are provided in each pixel, it is possible to obtain the electronic shutter function by means of which the shutter open period can be adjusted at will. Therefore, the depth of field can be adjusted freely in accordance with intension of a user. Moreover, according to the invention all the pixels store simultaneously the signal charges for the same shutter open period, it is possible to pick-up a sharp image of an object moving at a high speed not only in the video camera mode, but also in the still camera mode to obtain the image signal having the high quality and reflecting the intension of the user faithfully.

What is claimed is:

1. A solid state image sensor comprising a plurality of image sensing elements, each image sensing element including
   a lateral type static induction transistor having a source and drain regions formed in a surface of a semiconductor body, and a signal readout gate means at least a part of which is formed between the source and drain regions;
   a light receiving gate means formed separately from the signal readout gate means and constituting a photoelectric converting region;

a transfer gate means formed between the signal readout gate means and the light receiving gate means; and a light shielding film applied on the semiconductor body except for the light receiving gate means.

2. A solid state image sensor according to claim 1, wherein said semiconductor body is formed by a semiconductor substrate of one conductivity type and a semiconductor layer of the other conductivity type and formed on the semiconductor substrate, said source and drain regions are constituted by semiconductor regions of the other conductivity type formed in the surface of semiconductor layer, and said light receiving gate means, transfer gate means and signal readout gate means comprise respective gate electrodes formed on the semiconductor layer via a gate insulating film.

3. A solid state image sensor according to claim 2, wherein said semiconductor layer is formed by an epitaxial layer.

4. A solid state image sensor comprising
a plurality of image sensing elements, each comprising a lateral type static induction transistor having source and drain regions formed in a surface of a semiconductor body, and a signal readout gate means at least a part of which is formed between the source and drain regions, a light receiving gate means formed separately from the signal readout gate means and constituting a photoelectric converting region, a transfer gate means formed between the signal readout gate means and the light receiving gate means and a light shielding film applied on the semiconductor body except for the light receiving gate means;

a shutter control means for controlling the light receiving gate means, transfer gate means and signal readout gate means in such a manner that during a light signal accumulation period light signal charges are stored in the light receiving gate means and at the end of the light signal accumulation period the light signal charges are transferred via the transfer gate means into the signal readout gate means and the light receiving means is reset to an initial condition; and signal readout means for reading out an output image signal in accordance with the light signal charges transferred into the signal readout gate means.

5. A solid state image sensor according to claim 4, wherein said semiconductor body is formed by a semiconductor substrate of one conductivity type and a semiconductor layer of the other conductivity type formed on the semiconductor substrate, said source and drain regions are constituted by semiconductor regions of the other conductivity type formed in the surface of semiconductor layer, and said light receiving gate means, transfer gate means and signal readout gate means comprise respective gate electrodes formed on the semiconductor layer via a gate insulating film.

6. A solid state image sensor according to claim 5, wherein said semiconductor layer is formed by an expitaxial layer.

7. A solid state image sensor according to claim 5, wherein said image sensing elements are arranged in a matrix form and said signal readout means reads out the image sensing elements successively by an XY address system.

8. A solid state image sensor according to claim 7, wherein
said signal readout means comprises a plurality of row lines to each of which signal readout gate electrodes of lateral type static induction transistors aligned in respective row are connected, a vertical scanning circuit connected to the row lines, a plurality of column lines to each of which drain regions of lateral type static induction transistors aglined in respective columns are connected, a video line commonly connected to the column lines via column selection transistors, and a horizontal scanning circuit connected to control electrodes of the column selection transistors, and said shutter control means comprises a shutter control circuit commonly connected to the light receiving gate electrodes via a shutter control line and to the transfer gate electrodes via a transfer control line, said shutter control circuit being connected to the vertical scanning circuit via a shutter trigger line.

9. A solid state image sensor according to claim 8, wherein said signal readout means further comprises a plurality of anti-selection transistors each of which comprises a first main electrode connected to a column line, a second main electrode and a control electrode connected to the horizontal scanning circuit via an inverter, and a ground line commonly connected to second main electrodes of the anti-selection transistors, whereby the source electrodes of all the static induction transistors are connected to the ground potential.

* * * * *